United States Patent
Lee et al.

(10) Patent No.: US 6,731,667 B1
(45) Date of Patent: May 4, 2004

(54) ZERO-DELAY BUFFER CIRCUIT FOR A SPREAD SPECTRUM CLOCK SYSTEM AND METHOD THEREFOR

(75) Inventors: Kyeongho Lee, Seoul (KR); Joonbae Park, Seoul (KR)

(73) Assignee: AnaPass Inc., Seoul (KR)

( * ) Notice: Subject to any disclaimer, the term of this patent is extended or adjusted under 35 U.S.C. 154(b) by 0 days.

(21) Appl. No.: 09/442,751

(22) Filed: Nov. 18, 1999

(51) Int. Cl.[7] .................. H04B 1/713; H04B 1/707; H04B 1/69
(52) U.S. Cl. .................. 375/130; 375/375; 375/376; 375/373
(58) Field of Search .................. 375/130, 375, 375/376, 373; 327/158; 331/25

(56) References Cited

U.S. PATENT DOCUMENTS

| | | | |
|---|---|---|---|
| 5,488,627 A | 1/1996 | Hardin et al. | 375/204 |
| 5,544,203 A | 8/1996 | Casasanta et al. | 375/376 |
| 5,548,249 A | 8/1996 | Sumita et al. | 331/1 A |
| 5,661,419 A | 8/1997 | Bhagwan | 327/8 |
| 5,663,665 A | 9/1997 | Wang et al. | 327/3 |
| 5,670,869 A | 9/1997 | Weisenbach | 323/313 |
| 5,727,037 A | 3/1998 | Maneatis | 375/376 |
| 5,815,016 A * | 9/1998 | Erickson | 327/158 |
| 5,859,550 A | 1/1999 | Brandt | 327/156 |
| 5,943,382 A * | 8/1999 | Li et al. | 375/375 |
| 6,252,465 B1 * | 6/2001 | Katoh | 331/25 |
| 6,292,507 B1 * | 9/2001 | Hardin et al. | 375/130 |

FOREIGN PATENT DOCUMENTS

WO    WO 96/41443    12/1996

OTHER PUBLICATIONS

Zhang, Michael T., "Notes on SSC and Its Timing Impacts," Intel, Rev 1.0, Feb, 1998, pp 1–8.

* cited by examiner

Primary Examiner—Stephen Chin
Assistant Examiner—Curtis Odom
(74) Attorney, Agent, or Firm—Fleshner & Kim, LLP

(57) ABSTRACT

A clock recovery circuit and a method for reducing electromagnetic emission (EMI) and increasing an attainable clock frequency includes a spread spectrum clock (SSC) generator that receives an input clock signal and generates a frequency-modulated clock signal, and a zero-delay buffer circuit that receives and buffers the modulated clock frequency signed to generated an output clock signal. The frequency-modulated clock signal and the output clock signal are phase-aligned such that there is no phase difference between the output clock signal and the modulated frequency clock signal. The clock recovery circuit also includes a delay-locked loop (DLL) circuit that reduces related art jitter and skew characteristics, and a phase detector circuit that eliminates phase ambiguity problems of a related art phase detector.

15 Claims, 17 Drawing Sheets

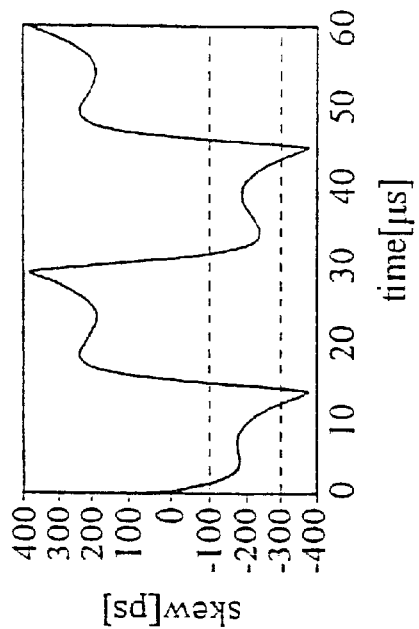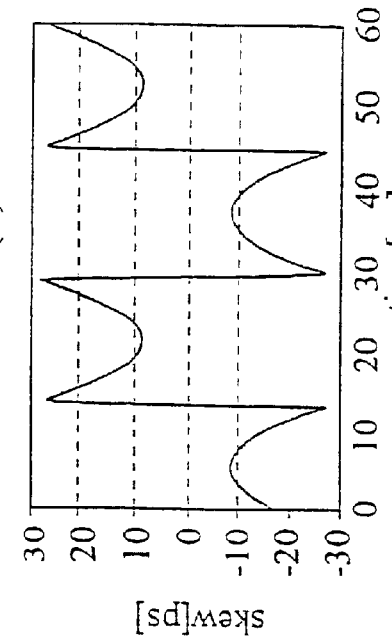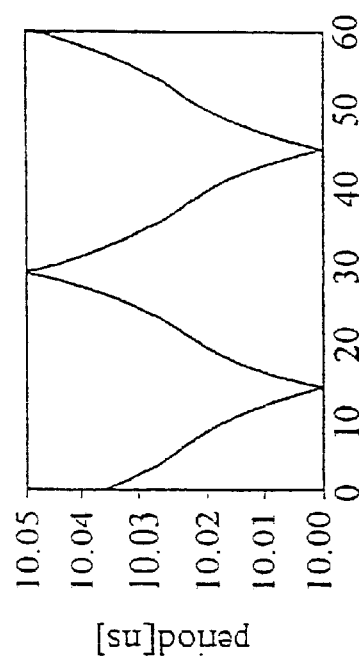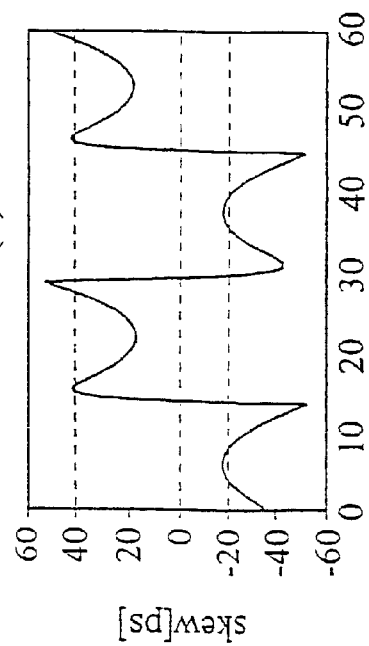
FIG. 5(a)
FIG. 5(b)
FIG. 5(c)
FIG. 5(d)
Simulated PLL tracking performance: (a) modulation of output clock period (b) tracking skew for $f_B = 440 \text{kHz}$ and $\theta = -0.89°$ (c) tracking skew for $f_B = 1.2 \text{MHz}$ and $\theta = -0.031°$ (d) tracking skew for $f_B = 1.2 \text{MHz}$ and $\theta = -0.0068°$.

FIG. 10(a) iCLK 
FIG. 10(b) oCLK 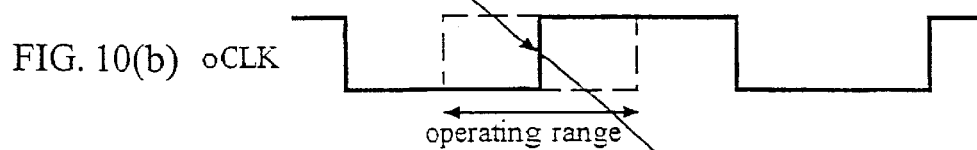
operating range
FIG. 10(c) oCLK  Coarse Tuning
FIG. 10(d) oCLK  Fine Tuning

ZERO-DELAY BUFFER CIRCUIT FOR A SPREAD SPECTRUM CLOCK SYSTEM AND METHOD THEREFOR

BACKGROUND OF THE INVENTION

1. Field of the Invention

The present invention relates to a zero-buffer circuit for a spread spectrum clock (SSC) system and a method therefor and more specifically, to a zero-delay buffer circuit having a delay-locked loop (DLL) based zero-delay buffer.

2. Background of the Related Art

In a related art of improving computer system efficiency, it is desirable to increase a processing speed by operating a central processing unit (CPU) at a higher frequency by increasing a clock frequency. An increase in clock frequency increases a frequency of the computer system, as peripherals (e.g., memory, graphic card) can also operate at a higher frequency. However, as the clock frequency increases, electromagnetic emission (EMI) increases due to an increased peak amplitude. As a result, EMI limits clock frequency improvements in the related art.

A related art technique known as spread spectrum clocking (SSC) reduces EMI and allows for an increased clock frequency by modulating the clock frequency along a modulation profile having a predetermined frequency. Because amplitude is reduced by the frequency modulation, EMI can be reduced while allowing an increase in the clock frequency. FIG. 1 illustrates a non-modulated spectral energy distribution 3 compared to the related art SSC frequency-modulated spectral energy distribution 1. A magnitude $\Delta$ of EMI reduction is determined by a modulation amount $\delta$ and a shape of the SSC spectral energy distribution 1.

FIG. 2 illustrates a related art modulation profile 9 used with the SSC technique. An SSC clock is modulated between a nominal frequency 5 of the constant-frequency clock $f_{nom}$, and a down-spreading frequency $(1-\delta) f_{nom}$ 7, where $\delta$ represents a spreading magnitude as a percentage of the nominal frequency $f_{nom}$ 5. The modulation profile 9 determines the shape of the SSC spectral energy distribution 1.

FIG. 3 illustrates a related art computer system that applies the related art SSC technique. In a motherboard 15, an SSC generator 11 receives an unmodulated clock input signal and generates a frequency-modulated clock signal in a first phase-locked loop (PLL) 13. The frequency-modulated clock signal is transmitted to a central processing unit (CPU) 17 and a peripheral board 19.

FIG. 4 illustrates a block diagram of the SSC generator 11. A first divider 49 receives the unmodulated clock input signal and generates an output received by the first PLL 13. In the first PLL 13, a first phase detector 35 receives an output signal of the first divider 49 and an input signal from a feedback divider 43 to generate an output signal that provides a measurement of a phase difference between the unmodulated clock input signal and the frequency-modulated signal. A first charge pump 37 receives the output signal of the first phase detector 35. The first charge pump 37 then generates charges in response to the output signal of the first phase detector 35. When a first loop filter 39 receives the charges from the first charge pump 37, the first loop filter 39 produces a DC voltage output. The DC voltage output of the first loop filter 39 is received by a first voltage controlled oscillator (VCO) 41. The first VCO 41 generates an output signal to a post divider 45 and the feedback divider 43. The post divider 45 then generates the frequency-modulated clock signal that is transmitted to the CPU 17 and the peripheral board 19, and the feedback divider 43 generates a reference signal for the first phase detector 35.

As shown in FIG. 3, the peripheral board 19 further processes the frequency-modulated clock signal in a zero-delay clock buffer 21 to generate an output clock signal for a peripheral device 23 (e.g., SDRAM, accelerated graphics port, etc.). The zero-delay clock buffer 21 includes a second PLL 25 having a second phase detector and a frequency detector 27, a second charge pump 29, a second loop filter 31, and a second voltage-controlled oscillator (VCO) 33.

However, the related art SSC technique has various disadvantages. For example, a jitter problem occurs due to a difference in period between a maximum frequency and a minimum frequency. As the input clock signal migrates from the non-modulated frequency over the modulation period, a change in period size occurs over clock cycles during a modulation event.

A skew problem also exists in the related art SSC technique due to a period difference between the frequency-modulated clock signal and the output clock signal. Because the output clock cannot be updated instantaneously, a period difference between the frequency-modulated clock signal from the motherboard 15 and the output clock signal to the peripheral device 23 develops. The cumulative effect of the period difference results in a significant phase error known as skew.

The skew and jitter of the related art SSC technique can be reduced by maximizing a bandwidth of the feedback loop in the second PLL 25 and minimizing a phase angle of an input-to-output transfer function of the modulation frequency. FIGS. 5 and 6 illustrate a relationship between increased feedback loop bandwidth, decreased phase angle, and decreased skew. However, even the related art SSC technique having optimized feedback loop bandwidth and phase angle still has the jitter and skew errors as discussed in Zhang, Michael T., *Notes on SSC and Its Timing Impacts*, Rev. 1.0, February 1998, pp. 1–8, which is incorporated by reference. Thus, the jitter and skew problems limit the clock frequency improvements that can be achieved by the related art SSC technique.

The above references are incorporated by reference herein where appropriate for appropriate teachings of additional or alternative details, features and/or technical background.

SUMMARY OF THE INVENTION

An object of the invention is to solve at least the related art problems and disadvantages, and to provide at least the advantages described hereinafter.

An object of the present invention is to provide an improved zero-delay buffer circuit and a method therefor.

Another object of the present invention is to improve the efficiency.

A further object of the invention is to minimize a reduces electromagnetic emission (EMI).

An object of the present invention is to also minimize the jitter.

Another object of the present invention is to minimize a skew error.

Still another object of the present invention is to minimize a delay for clock skew elimination.

It is another object of the present invention to provide a phase detector that eliminates a phase ambiguity problem.

A zero-delay buffer circuit for generating an output clock signal having a reduced EMI includes a spread spectrum clock (SSC) generator circuit that receives an input clock signal and generates a modulated frequency clock signal, and a zero-delay buffer circuit that receives and buffers said modulated frequency clock signal to generate an output clock signal, the zero-delay buffer circuit aligning a phase of the modulated frequency clock signal and the output clock signal such that there is no phase difference between the output clock signal and the modulated frequency clock signal.

A delay-locked loop circuit embodying the present invention further includes a phase detector that receives a modulated frequency clock signal, measures a phase difference between the modulated clock frequency signal and the output clock signal, and generates phase detector outputs; a charge pump circuit coupled to the phase detector device, wherein the charge pump circuit receives the phase detector outputs and generates charges; a loop filter circuit coupled to the charge pump, wherein the loop filter circuit receives the charges and generates a DC voltage output; and a voltage controlled delay chain (VCDC) circuit coupled to the loop filter and the phase detector, wherein the VCDC circuit aligns phases of the modulated frequency clock signal and the output clock signal.

A phase detection device embodying the present invention includes a first phase detector circuit that receives a modulated frequency clock signal and generates first and second pulse signals, wherein the first and second pulse signals measure on of a rising edge and a falling edge of the modulated frequency clock signal and the output clock signal, respectively; a second phase detector circuit that receives the modulated frequency clock signal and generates third and fourth pulse signals, wherein the third and fourth pulse signals measure one of the rising edge and the falling edge of the modulated frequency clock signal and the output clock signal, respectively; and a signal divider circuit to alternatively operate the first and second phase detector circuit, memory states of the first phase detector circuit and the second phase detector circuit are periodically reset.

A method embodying the present invention includes the steps of generating a modulated frequency clock signal based on spread spectrum modulation having an amplitude less than an amplitude the input clock signal; and aligning a phase of the modulated frequency clock signal with the output clock signal to eliminate phase differences between the output clock signal and the modulated frequency clock signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 5 and 6 illustrate a relationship between feedback loop bandwidth, phase angle and skew for the related art SSC technique;

FIGS. 10(a)–10(d) illustrate an operation of the DLL circuit according to the preferred embodiment of the present invention;

DETAILED DESCRIPTION OF PREFERRED EMBODIMENTS

Figure 8:
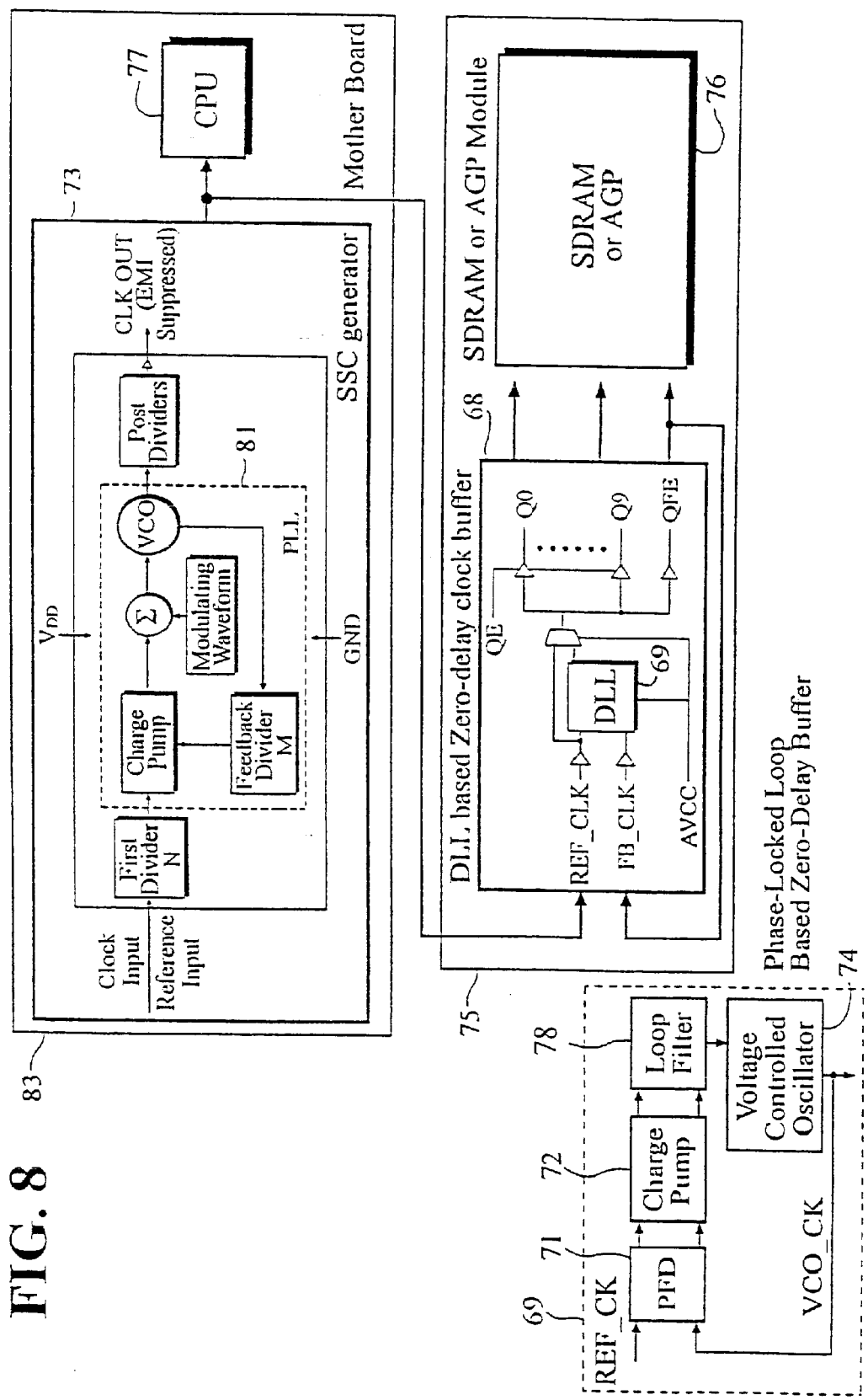
FIG. 8 illustrates a block diagram of a clock recovery circuit according to a preferred embodiment of the present invention.

FIG. 8 illustrates a block diagram of a spread spectrum clocking (SSC) clock system circuit according to a preferred embodiment of the present invention. A motherboard 83, a SSC generator 12, a PLL circuit 81 and a CPU 77 are included. A peripheral board 75 includes a zero-delay clock buffer circuit 68 having a delay-locked loop (DLL) circuit 69. The zero-delay clock buffer circuit 68 receives a frequency-modulated clock signal from the SSC generator and outputs an output clock signal to a peripheral device (e.g., SDRAM, accelerated graphics port, etc.) 76. The DLL circuit 69 includes a phase detector 71, a charge pump 72, a loop filter 73, and a voltage controlled delay-chain (VCDC) circuit 74.

Figure 9:
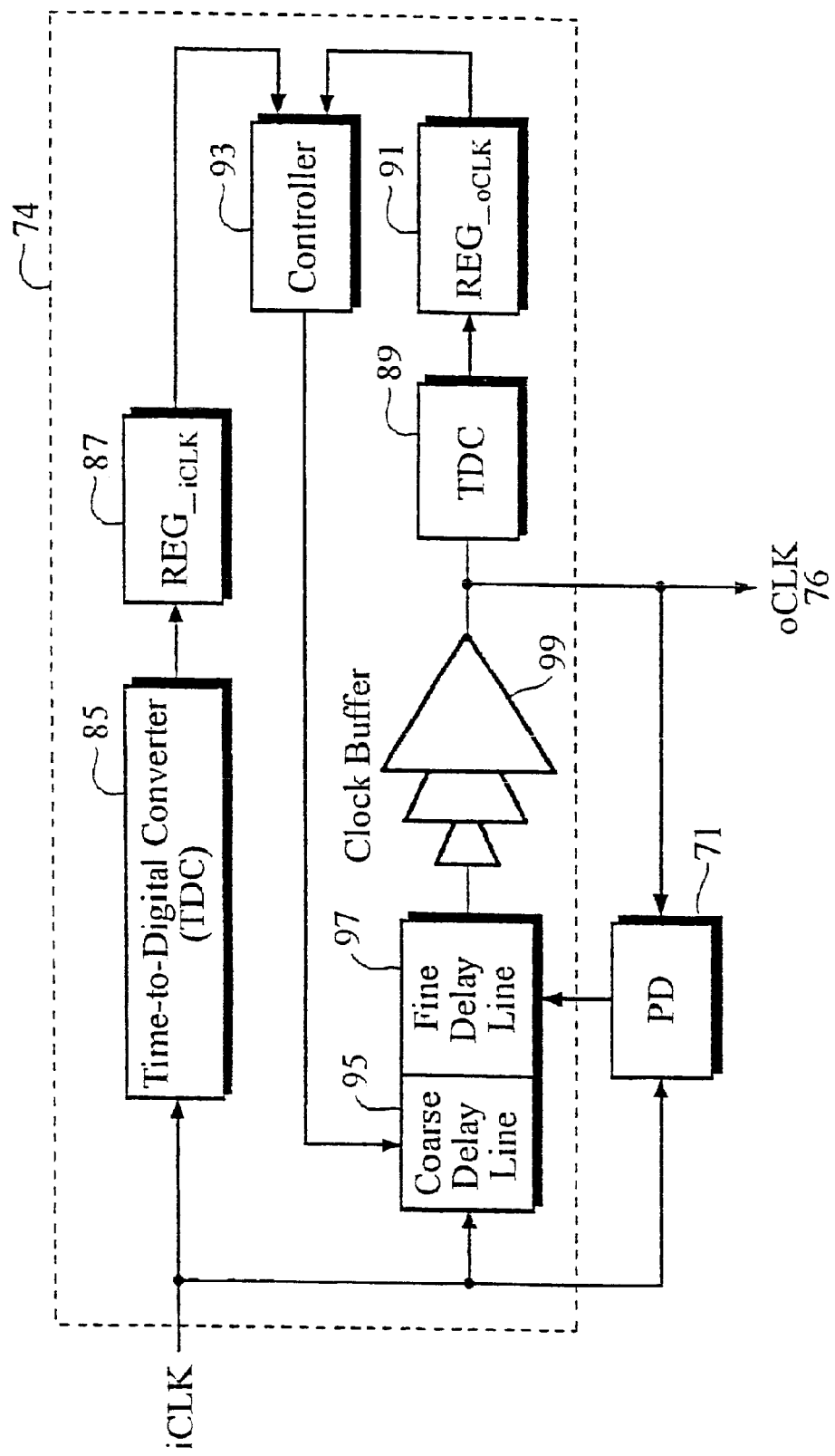
FIG. 9 illustrates a block diagram of a delay-locked loop (DLL) circuit according to a preferred embodiment of the present invention.

FIG. 9 illustrates a block diagram of the DLL circuit 69 according to the preferred embodiment of the present invention. The DLL circuit 69 includes a first time-to-digital converter (TDC) 85 coupled to a first register 87, and a second TDC 89 coupled to a second register 91. The first and second registers 87, 91 are coupled to a controller 93, which is coupled to a first coarse delay line circuit 95 and a first fine delay line circuit 97. The phase detector 71 is coupled to the charge pump 72 and the loop filter 73, and is also coupled to the first fine delay line circuit 97. The first fine delay line circuit 97 is also coupled to a clock buffer 99, which is coupled to the second TDC 89 and the peripheral device 76.

In a preferred method embodying the present invention, the phase detector 71 receives the frequency-modulated clock signal received from the SSC generator. The phase detector 71 then detects a phase difference between the modulated frequency clock signal and the output clock signal, and outputs a pulse signal to the charge pump 72. The charge pump 72 creates a charge based on the pulse signal from the phase detector 71, and outputs a signal to the loop filter 73. The loop filter 73 then outputs a voltage signal to the VCDC circuit 74, where the phase difference detected by the phase detector 71 is eliminated. The VCDC circuit 74 then produces an output signal that is transmitted to a feedback loop and a peripheral device 76.

In the method embodying the preferred embodiment of the present invention, the VCDC circuit 74 operates as follows. The first TDC 85 receives and measures a period of the modulated frequency clock signal and converts the measured period into a first digital output signal. The first register 87 receives and stores the digital output of the first TDC 85. The second TDC receives an output of the clock buffer circuit 99, and measures a total delay time of the first coarse delay line circuit 95 and the first fine delay line circuit 97. The total delay time is converted into a second digital output signal that is received and stored in the second register 91. The controller 93 receives the first and second digital output signals from the first and second registers 87, 91, and generates a control signal that is transmitted to the first coarse delay line circuit 95.

FIGS. 10(a)–10(d) illustrate an operation of the DLL circuit 69 according to the preferred embodiment of the present invention. The first coarse delay line circuit 95 delays the output clock signal based on the control signal and transmits an output signal to the first fine delay line circuit 97. The first fine delay line circuit 97 receives an output of the phase detector 71 and finely tunes the delay by aligning rising edges of the modulated frequency clock signal and the output clock signal. In alternative embodiments of the present invention, falling edges of the modulated frequency clock signal and the output clock signal may be used for alignment.

Figure 11A:
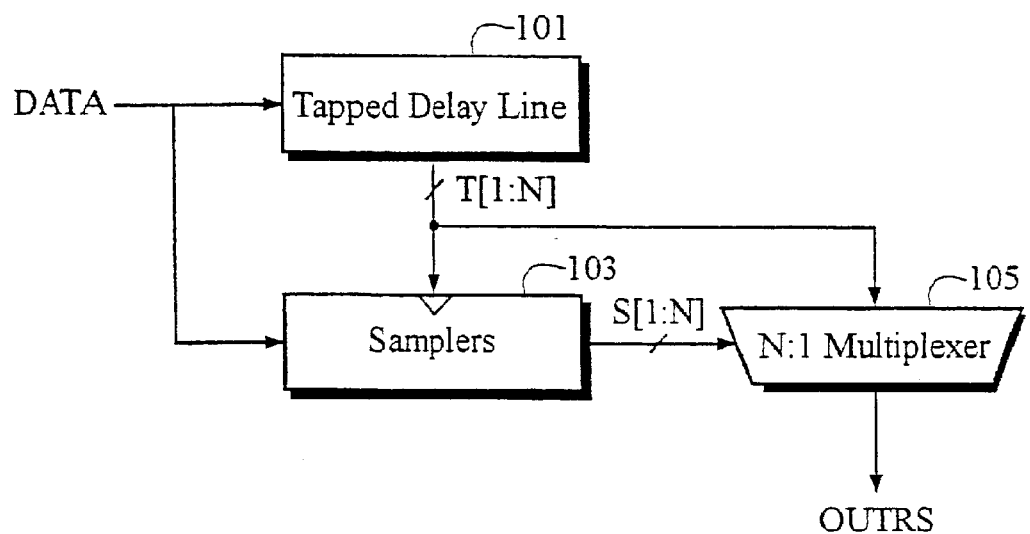
FIGS. 11a and 11b illustrate a time-to-digital converter (TDC) according to a preferred embodiment of the present invention.
Figure 11B:
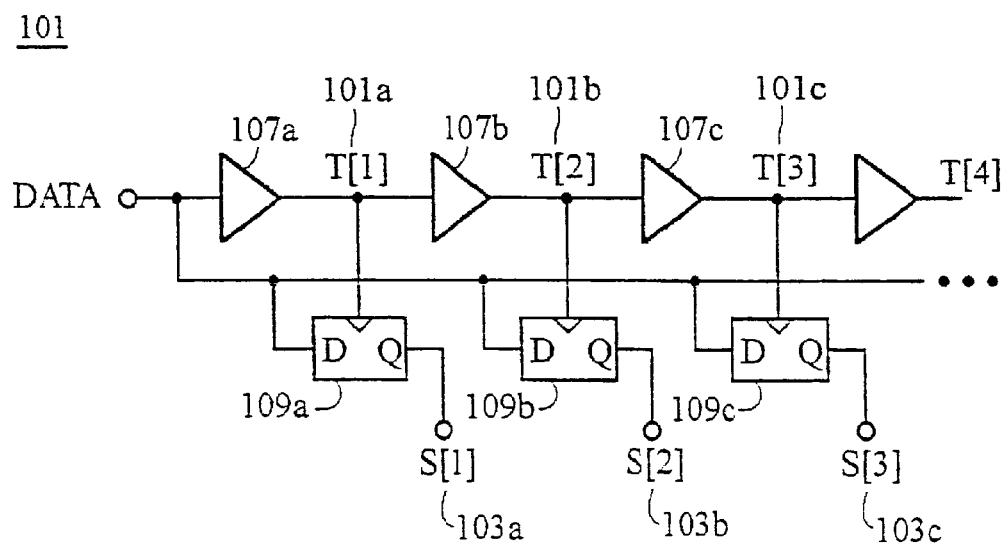

FIGS. 11a and 11b illustrate a TDC according to the preferred embodiment of the present invention. As shown in FIG. 11a, the TDC includes a tapped delay line 101 having a plurality of taps, a plurality of samplers 103, and a multiplexer 105. As shown in FIG. 11b, each of the taps 101a includes a buffer 107a that receives an input signal and generates an output signal transmitted to a subsequent tap 101b and a corresponding flip flop gate 109a that serves as the sample 103. The flip flop gate 109a also receives the input signal, and generates an output sample signal. Each of the delay taps 101a are coupled in series to a subsequent delay tap 101b, and a last delay tap is coupled to the multiplexer 105. Similarly, the output sample signals are coupled to the multiplexer 105. The multiplexer than produces a digital output signal.

Figure 12:
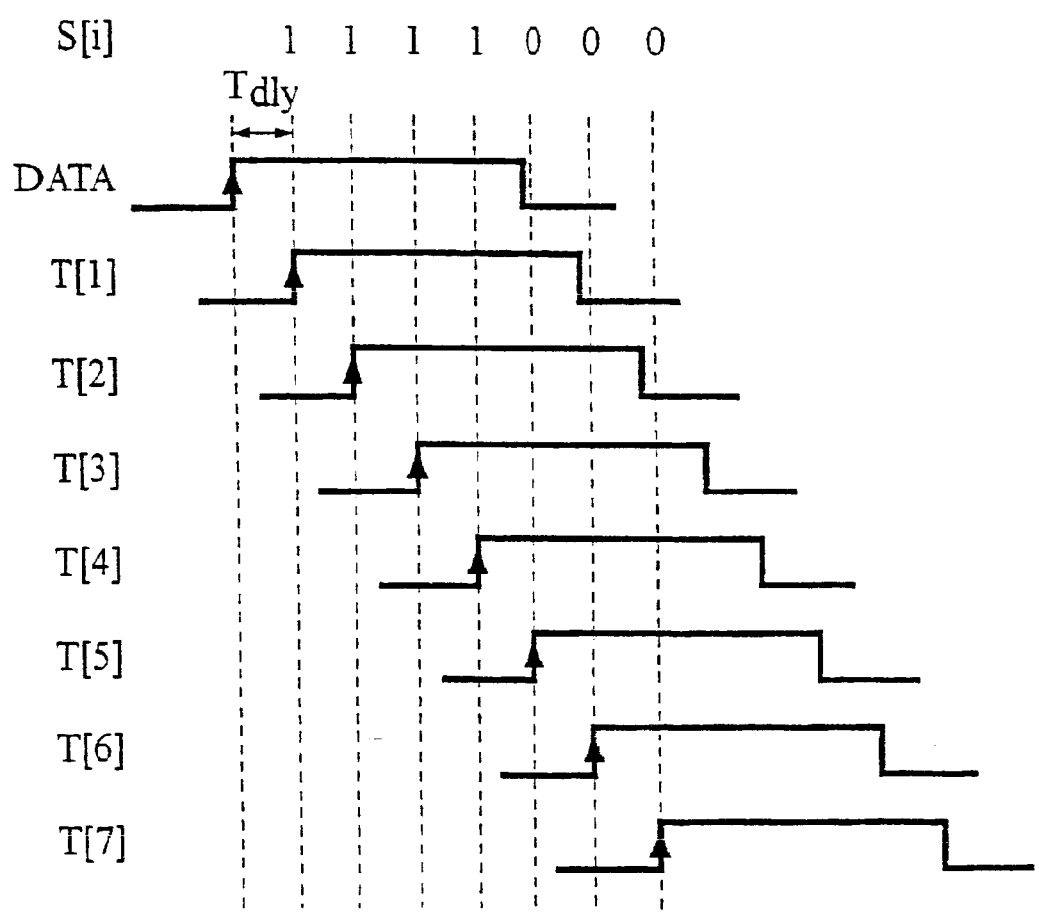
FIG. 12 illustrates an operation of the TDC according the preferred embodiment of the present invention.

FIG. 12 illustrates an operation of the TDCs according to the preferred embodiment of the present invention. A duration of an input signal is measured by calculating the number of delay taps in the input signal. In the preferred embodiment of the present invention, the input signal of the first TDC is the modulated frequency signal, and the input signal of the second TDC is the output clock signal. As each of the delay taps produces a delayed version of the input signal, corresponding delayed edges are produced at each tap of the delay line. Thus, the D flip-flop gate 109 coupled to the delay tap 101 samples the data. When the delay time is less than the duration of the input signal, the value of the sampler output is set to "1" In FIG. 14, the delay time is less than the input signal for an interval of four delay taps. Thus, the sampler output is set to "1" until T[5], when the sampler output changes to "0." The sampler output signal produces a time value that is converted to a digital value by the multiplexer 105. Accordingly, the time value is then stored in the registers 87, 91.

Figure 13:
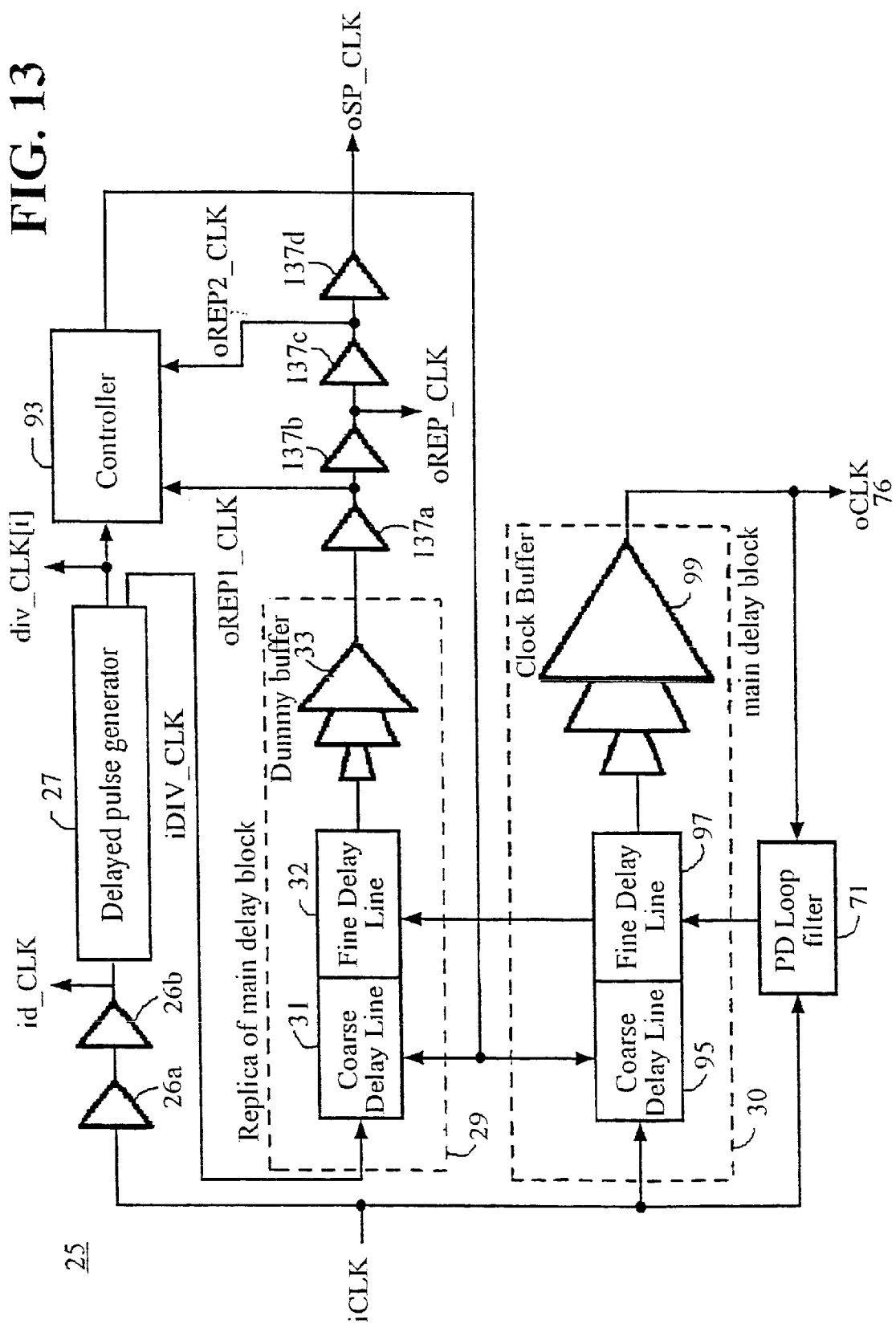
FIG. 13 illustrates a block diagram of the DLL circuit according to another preferred embodiment of the present invention.

FIG. 13 illustrates the DLL circuit according to another preferred embodiment of the present invention, wherein the first and second TDCs 85, 89 have been replaced by a delayed pulse generator 27 and a second delay circuit 29, respectively. The second delay circuit 29 includes a second coarse delay line circuit 31, a second fine delay line circuit 32, and a dummy clock buffer 33 that are substantially similar to a first delay circuit 30 including the first coarse delay line circuit 95, the first fine delay line circuit 97, and the clock buffer circuit 99. Further, the second delay circuit 29 and the first delay circuit 30 share common control nodes in the DLL circuit 25. The dummy clock buffer 33 preferably has substantially the same delay as the clock buffer circuit 99. Thus, a nominal delay of the second delay circuit 29 approaches the delay between the frequency modulated clock signal iCLK to the output clock signal oCLK.

Figure 14:
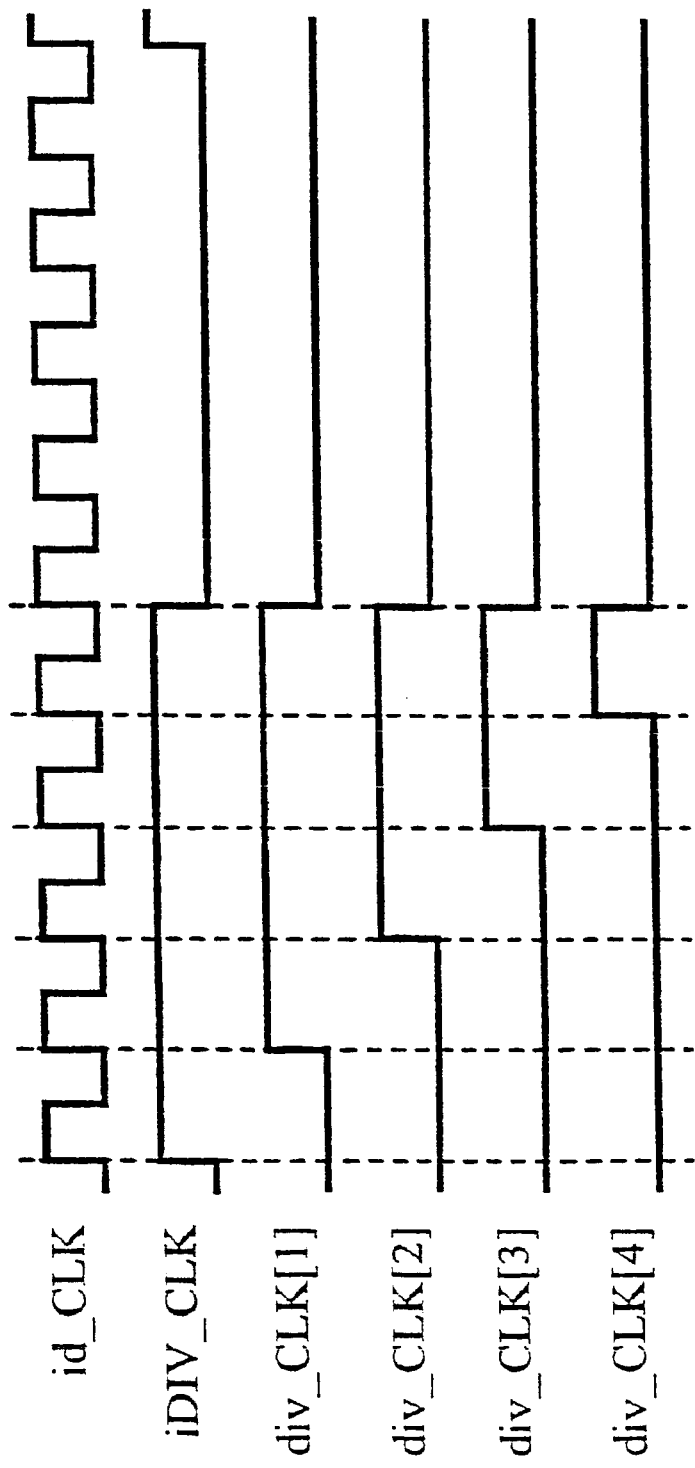
FIG. 14 illustrates an operation of the DLL circuit according to another preferred embodiment of the present invention.

FIG. 14 illustrates an operation of the DLL circuit according to another preferred embodiment of the present invention. The input to the delayed pulse generator 27 is represented by id_CLK, while IDIV_CLK and div_CLK [i] represent first and second outputs, respectively, of the delayed pulse generator 27 coupled to the second delay circuit 29 where I equals a number of second output signals. Dummy delay elements 26a, 26b match a delay of the first delay circuit 29 output oREP_CLK. Each output div_CLK [i] of the delayed pulse generator 27 to the controller 93 is aligned with a rising edge of the delayed frequency modulated clock signal id_CLK. Additional delay elements 137a, 137b, 137c, 137d are coupled in series to delay an output of the dummy clock buffer 33, as shown in FIG. 13. Preferably, two delay elements 137a, 137bare counterparts to the dummy delay elements 26a, 26b to output oREP_CLK.

Figure 15:
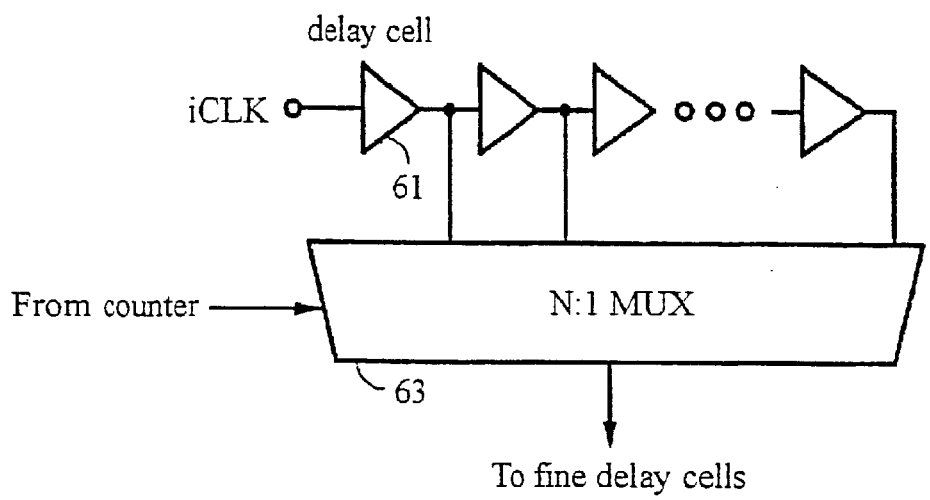
FIG. 15 illustrates a block diagram of the coarse delay line circuit according to another preferred embodiment of the present invention.

FIG. 15 illustrates a block diagram of the second coarse delay line circuit 31. A N:1 multiplexer 63 selects a tap, for example tap 61, from a plurality of taps, and the selected tap 61 is input to the second fine delay line circuit 32. The tap selection is controlled by an UP counter coupled to the multiplexer 63. The UP counter moves the selected tap 61 to a direction of increasing delay time during the coarse tuning operation, and initialized to have a minimum value at the start of the coarse tuning operation. Thus, it is possible to achieve phase lock with only the UP counter, and an UP/DOWN counter is not required. As a result, jitter can be reduced by engaging a smaller number or the smallest number of taps 61 for phase locking.

Figure 16:
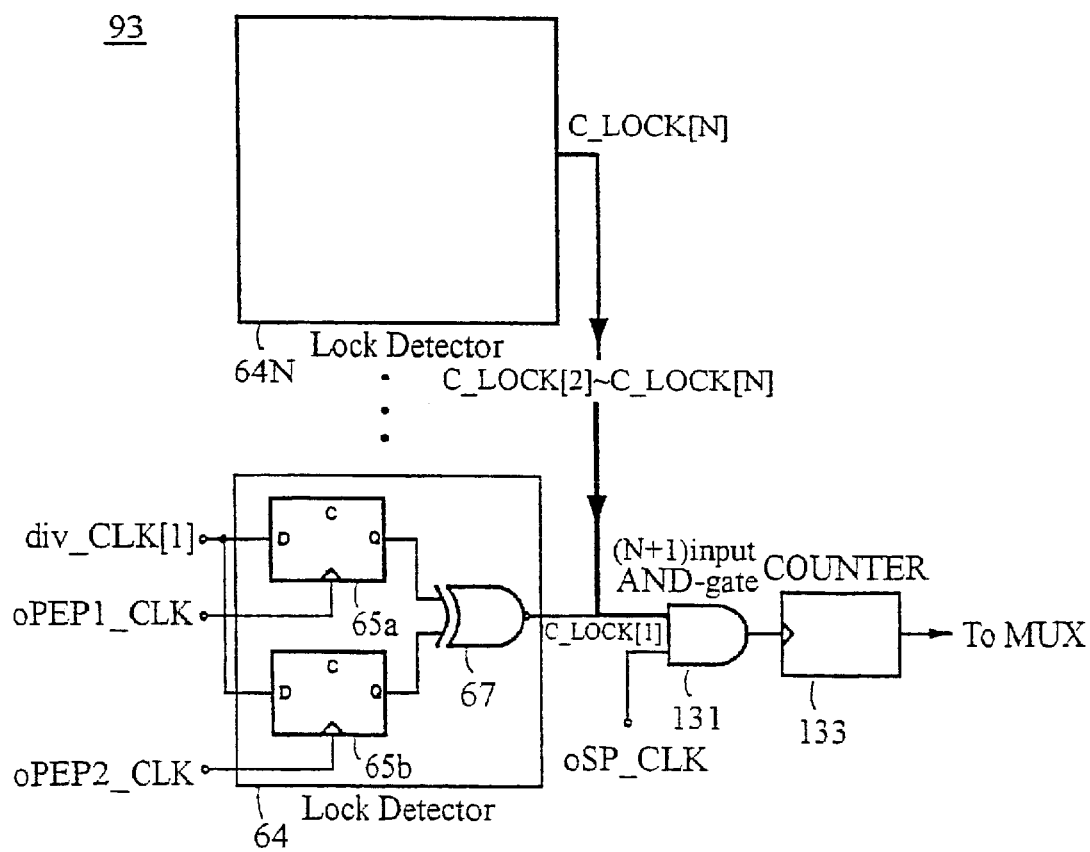
FIG. 16 illustrates a block diagram of the controller circuit with a lock detector circuit according to another preferred embodiment of the present invention.

FIG. 16 illustrates a block diagram of the controller 93 according to another preferred embodiment of the present invention. Each of a plurality of lock detectors 64. 64n includes first and second D flip-flops 65a, 65b that receive first and second outputs of the second delay circuit 29 oREP1_CLK , oREP2_CLK that are compared to the first output div_CLK [1] of the delayed pulse generator 27. The number of lock detectors preferably equals the number of second output signals div_CLK [i] transmitted from the delayed pulse generator 27 to the controller 93. The two delayed outputs oREP_CLK, oREP2_CLK form a sampling window that indicates that the coarse locking process has been completed. Because the coarse locking process locates a delayed output oREP_CLK in the vicinity of the delayed frequency modulated clock signal id_CLK, the coarse locking process has been accomplished when the sampled values at each of the D flip-flops 65a, 65b differs from each other.

An output of each of the D flip-flops 65a, 65b is input to a NOR gate 67, and an output of the NOR gate 67 forms an output of the lock detector 64 C_LOCK[1]. Each lock detector output C_LOCK[i] is output to a corresponding input node of a (N+1)input AND gate 131, which is coupled to the UP counter 133. The UP counter 133 is disabled when one of the lock detector outputs C_LOCK[i] has a zero value, and a value of the UP counter 133 increases when a low-to-high transition of oSP_CLK increases a delay of the output of the second delay circuit oREP_CLK. The second delayed output of the second delay circuit 29 oREP2_CLK is delayed to produce an output oSP_CLK that accounts for a timing margin required to operate the UP counter 133.

An initial delay time of the delayed output of the second delay circuit 29 oREP_CLK should be less than the delay time of a last delayed pulse required to achieve coarse lock. Otherwise, coarse locking cannot be achieved because no lock detector 64 output C_LOCK[i] equals zero. The delay time of the delayed output oREP_CLK of the second delay circuit 29 should be less than half of the delay time of the delay pulse generator 27 output IDIV_CLK that is the input of the second delay circuit 29. The actual number of delay pulses is determined by an operating speed and a coarse estimation to the time from the frequency modulated clock signal iCLK to the output clock signal oCLK.

Figure 17:
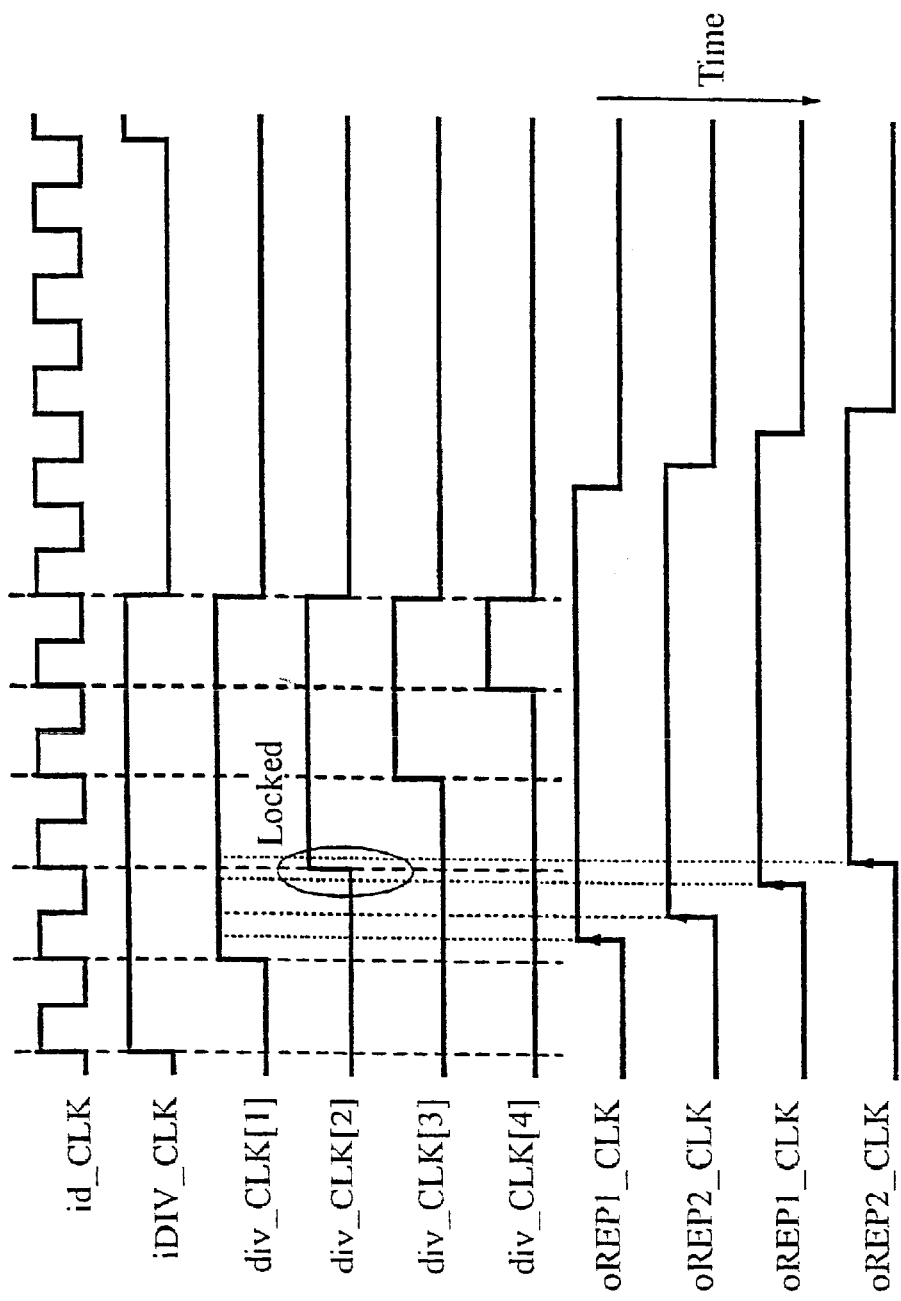
FIG. 17 illustrates a coarse tuning operation according to another preferred embodiment of the present invention.

FIG. 17 illustrates operations of the coarse tuning operation. Here, the lock window is between the first and second delayed pulse generator outputs div_CLK [1], div_CLK [2]. Because the lock detector circuit 64 outputs C_LOCK [i] equal 1, the second delay circuit 29 output oREP_CLK is increased. After several comparison cycles, the div_CLK [2] is in the locking window, and the coarse tuning operation is stopped.

Figure 18:
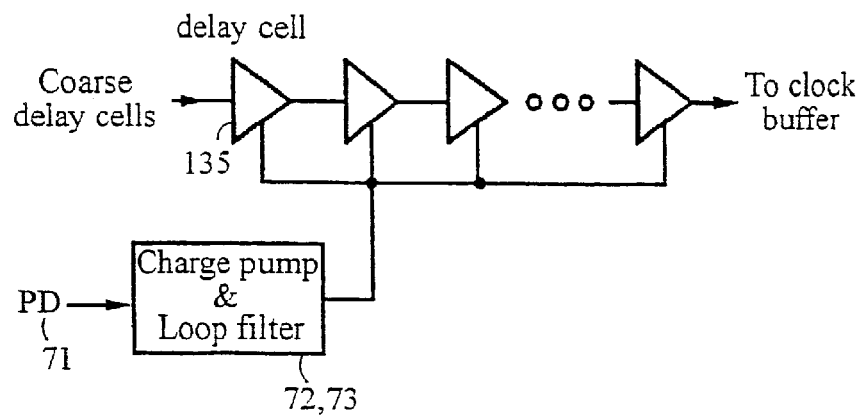
FIG. 18 illustrates a block diagram of a fine delay line circuit according to another preferred embodiment of the present invention.

FIG. 18 illustrates a block diagram of the first fine delay line circuit 97, according to another preferred embodiment of the present invention. After the coarse tuning operation has been completed for the first coarse delay line circuit 95, the phase detector 71 adjusts the delay time of the first fine delay line circuit 97 to achieve a phase lock between the frequency modulated clock signal iCLK and the output clock signal oCLK. The phase detector 71 produces UP and DOWN pulses, and a pulse width depends on the phase difference of those two signals. The charge pump circuit 72 and attached loop filter 73 convert the phase difference into the control voltage. A fine delay line circuit output is then transmitted to the clock buffer 99.

The loop filter 73 of the DLL circuit is usually of the first order, and thus the overall loop of the DLL circuit is also first order. As is known in the related art, the first order loop has no stability problem and thus the loop band width of the DLL circuit can be made as large as necessary. Thus, jitter and skew can be minimized or eliminated when the DLL circuit is used as a zero delay buffer in the SSC environment.

Figure 1:
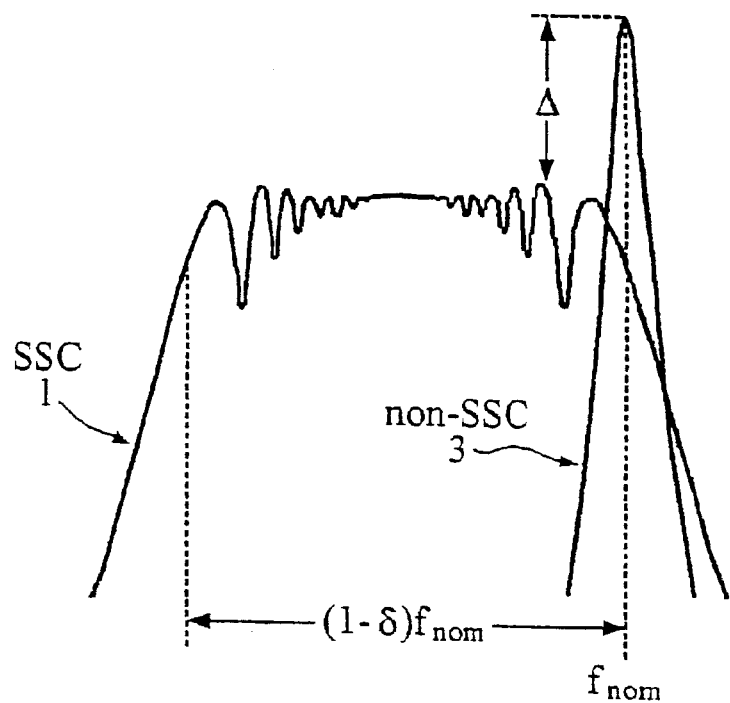
FIG. 1 illustrates a spectral energy distribution curve for a fundamental harmonic of related art spread spectrum clocking (SSC) and non-SSC clocks.
Figure 2:
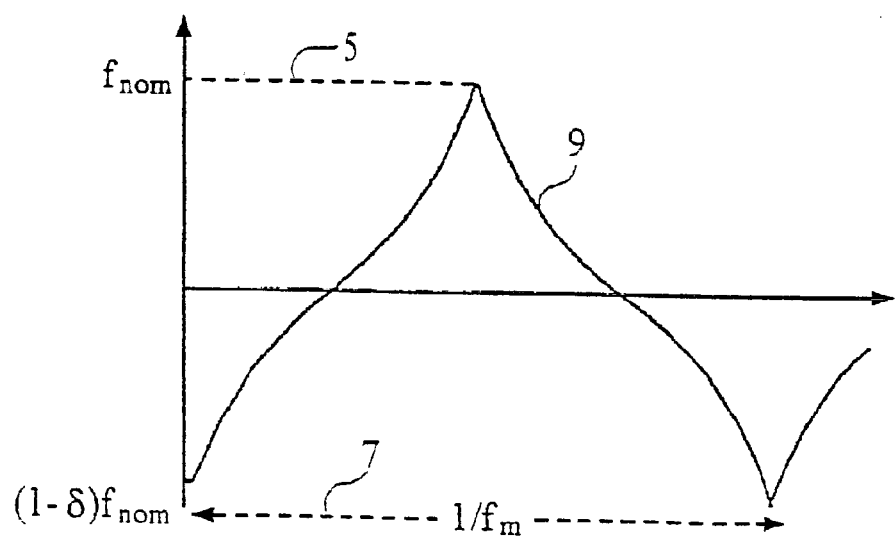
FIG. 2 illustrates a related art SSC modulation profile.
Figure 3:
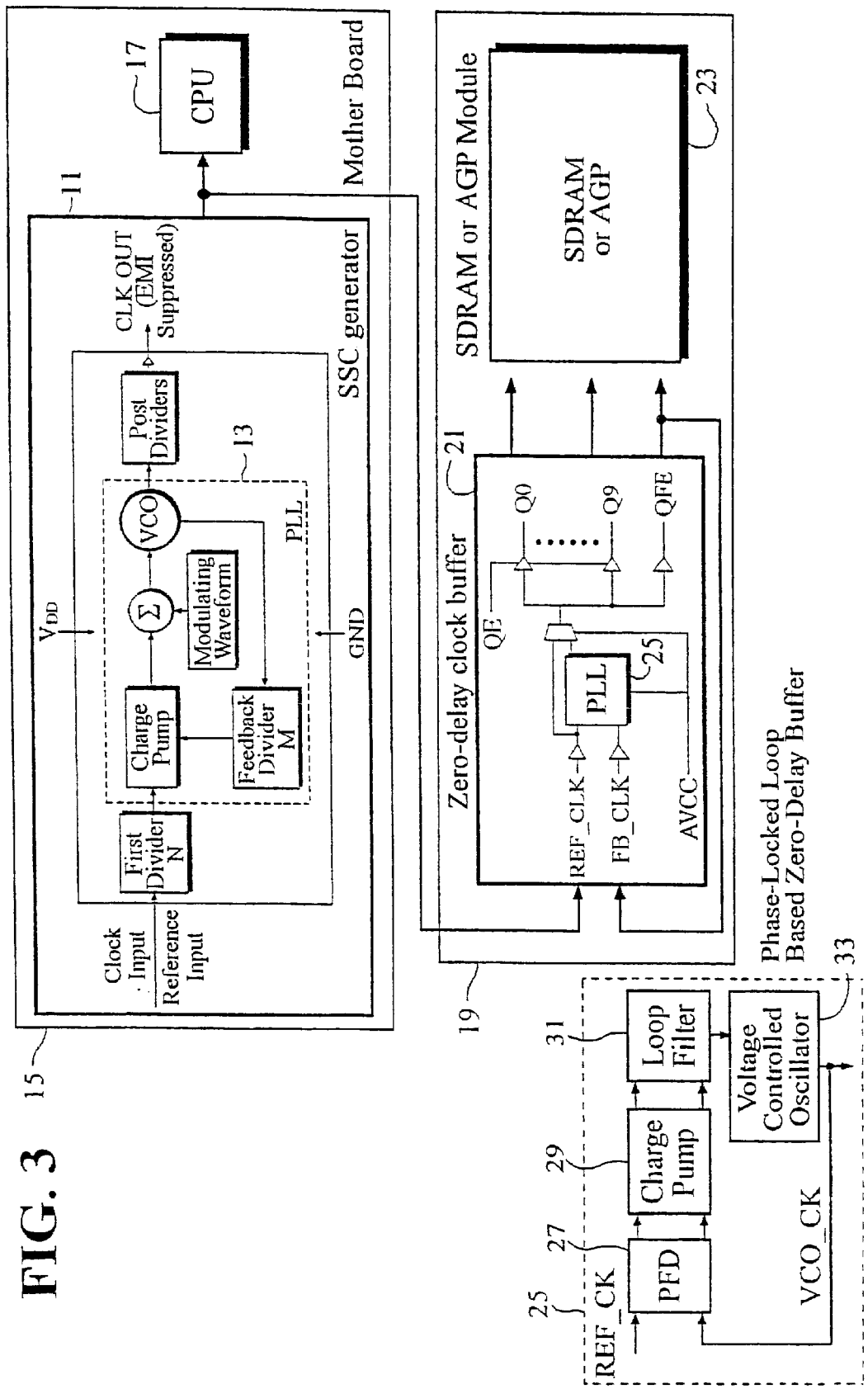
FIG. 3 illustrates a block diagram of the related art SSC system architecture.
Figure 4:
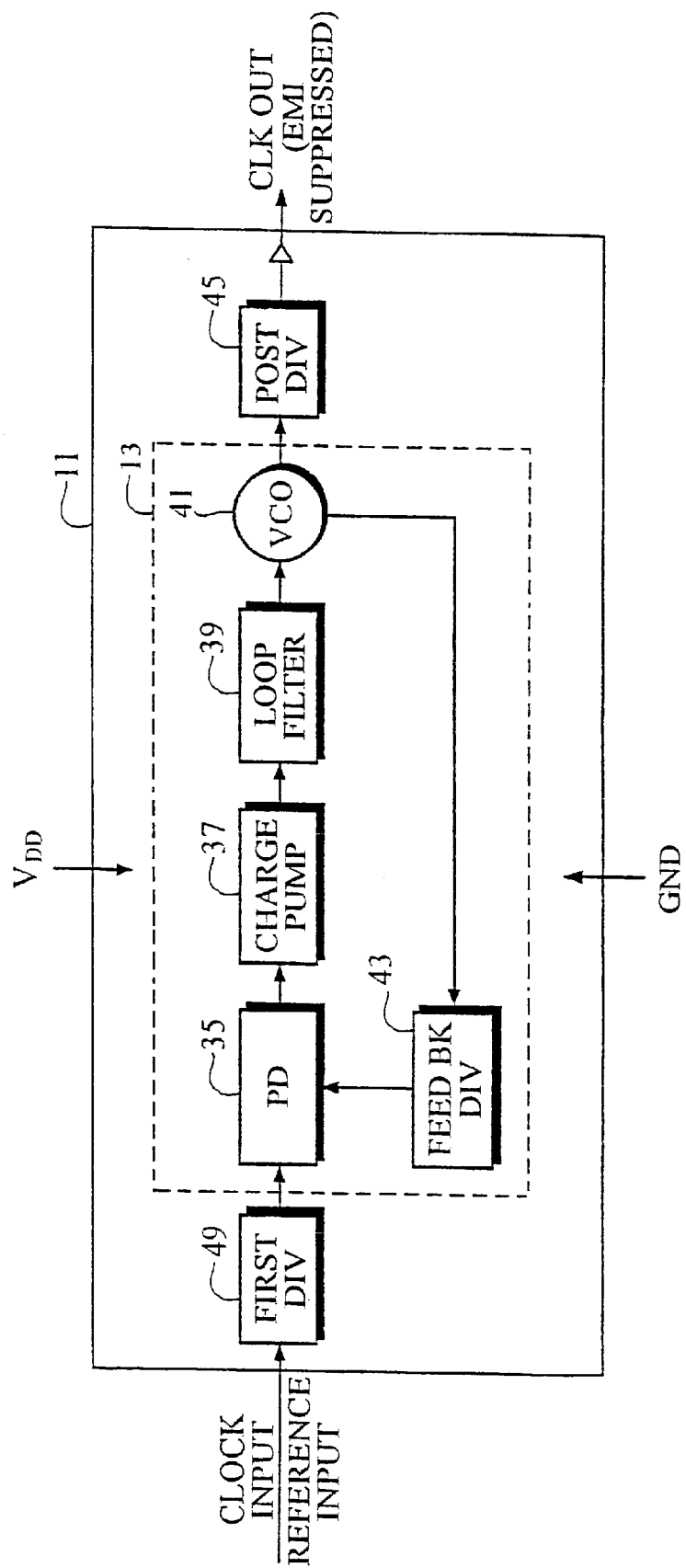
FIG. 4 illustrates a block diagram of the related art SSC generator having a phase-locked loop (PLL) circuit.
Figure 6A:
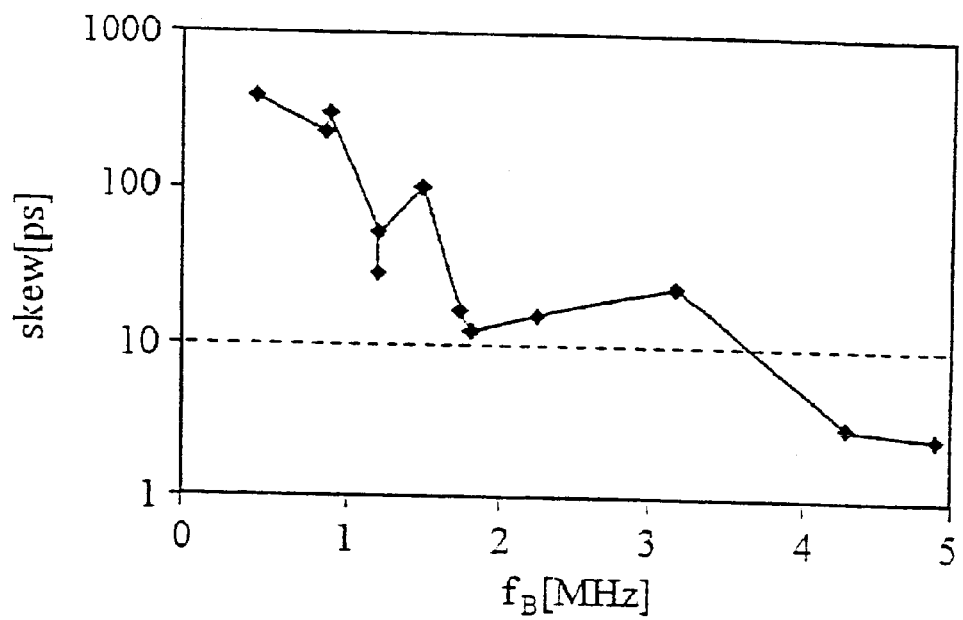
Figure 6B:
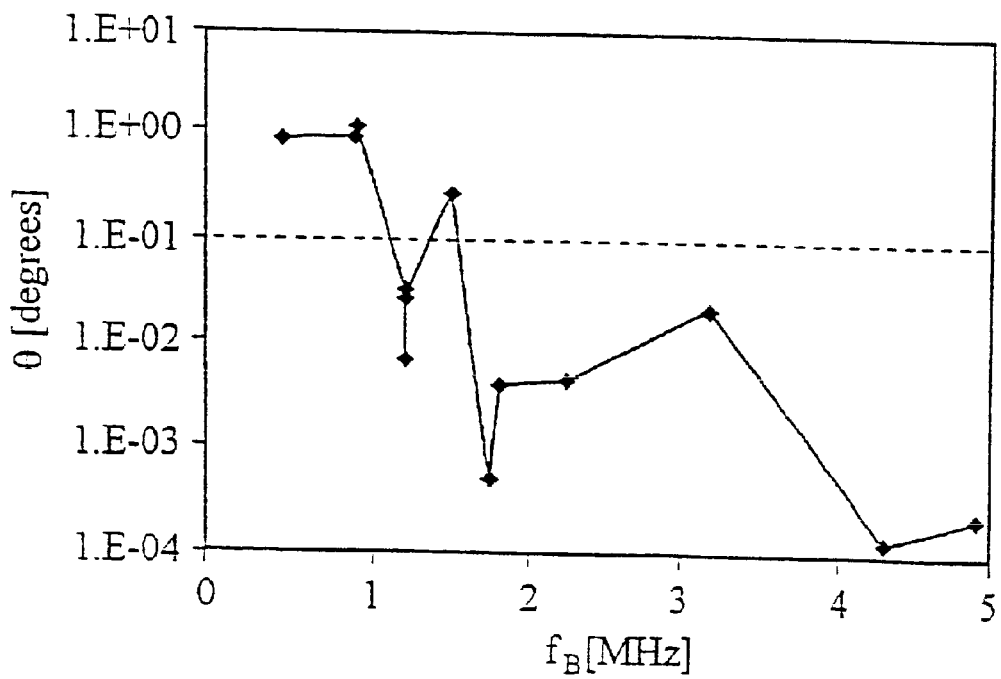
Figure 7A:
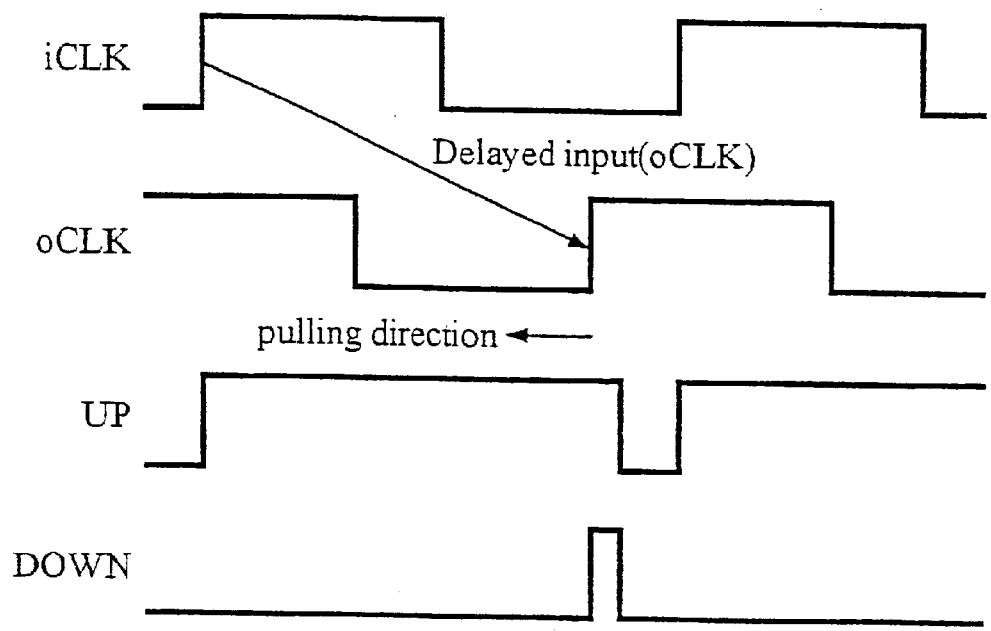
FIGS. 7a and 7b illustrate a phase ambiguity problem of the related art phase detector.
Figure 7B:
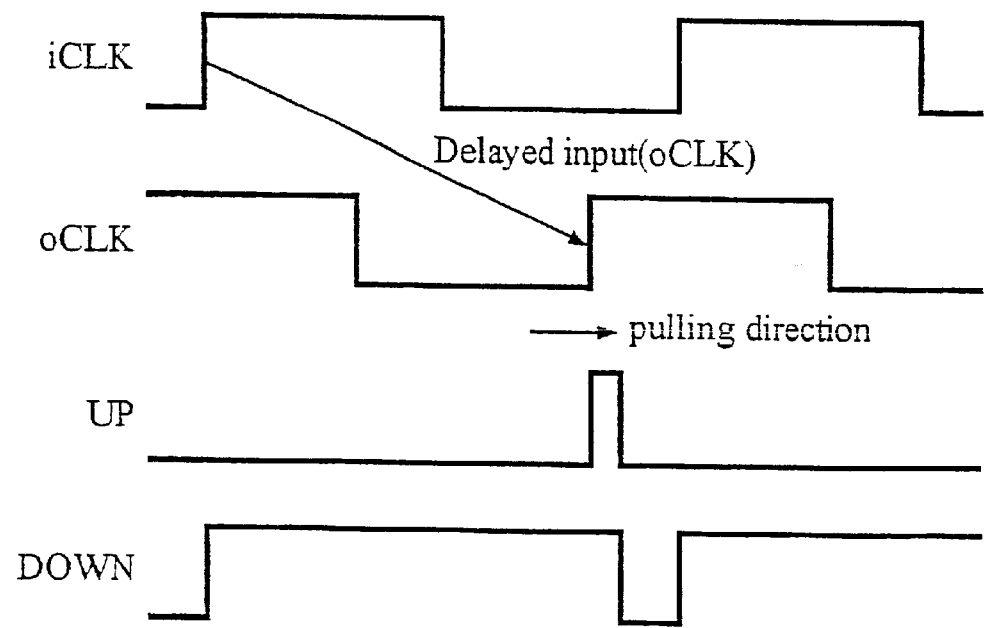

Further, a phase ambiguity problem exists when a related art phase detector is applied to the zero-delay clock buffer circuit 21 illustrated in FIG. 8. FIG. 7 illustrates an operation of the related art phase detector circuit 27a. The operation of the phase detector circuit 27a is directly affected by a sequence of the rising edge of an input clock signal ICLK and an output clock signal oCLK. As shown in FIG. 7a, the phase detector generates a first pulse signal UP indicating a rising edge of the input clock signal ICLK, and a second pulse signal DOWN indicating a rising edge of the output clock signal oCLK, to calculate the phase difference. When a pulse width of the first pulse signal UP is generated first, phase tracking is performed in the wrong direction. However, FIG. 7b shows that phase tracking is performed in the correct direction when the second pulse signal DOWN is generated first. Thus, an incorrect phase difference output may result in the related art phase detector circuit.

Figure 19:
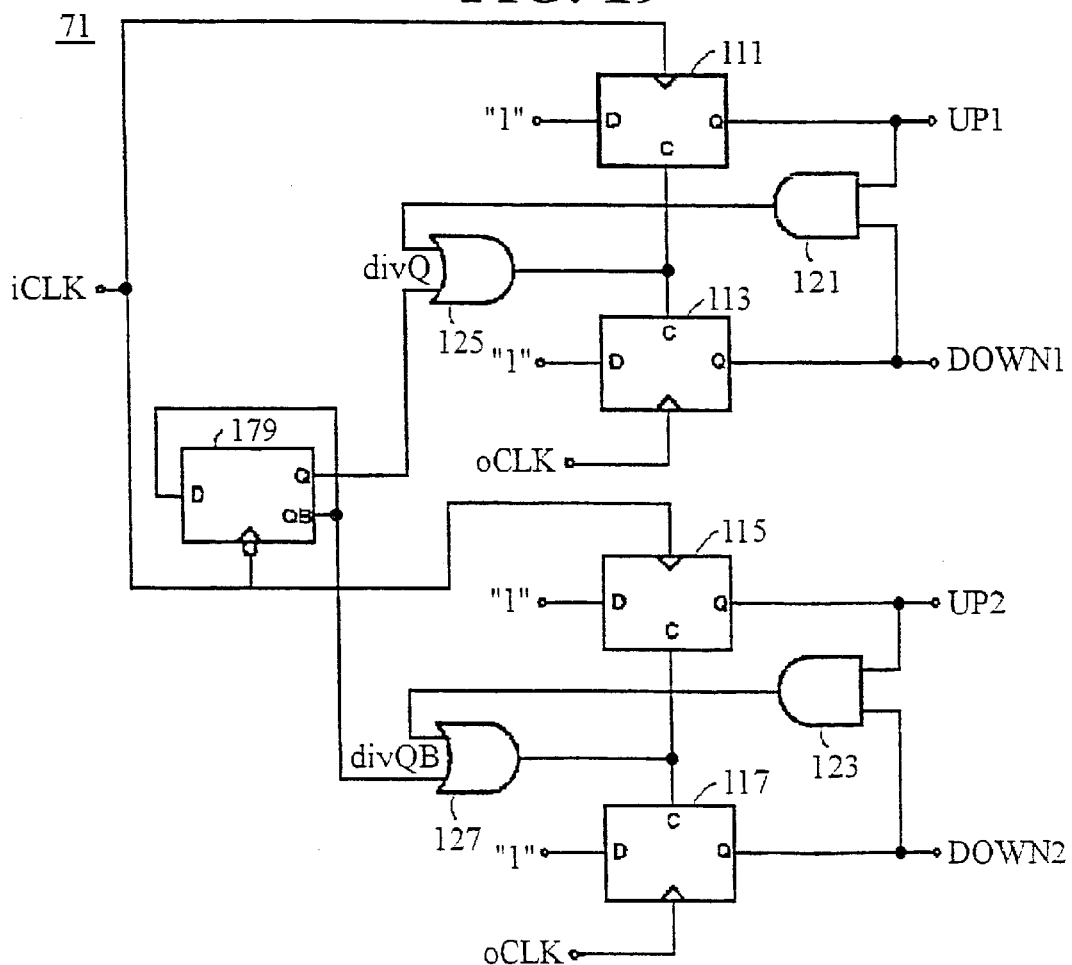
FIG. 19 illustrates a phase detector according to the preferred embodiment of the present invention.

FIG. 19 illustrates the phase detector 71 according to the preferred embodiment of the present invention. The phase detector 71 includes a first phase detector circuit and a second phase detector circuit coupled to a signal divider circuit. The first and second phase detector circuits can be in either a "reset" or an "operational" mode, and the mode of the first phase detector circuit must differ from the mode of the second detector circuit, wherein the mode is determined by an output of the signal divider.

The first phase detector circuit includes first and second D flip-flops 111,113, a first AND gate 121 and a first OR gate 125, and the second phase detector circuit includes third and fourth D flip-flops 115,117, a second AND gate 123 and a second OR gate 127. The signal divider circuit includes a fifth D flip-flop 119 coupled to the first phase detector circuit and the second phase detector circuit.

In the first phase detector circuit, the first D flip-flop 111 is coupled to the modulated frequency clock signal ICLK and generates a first pulse signal UP1, and the second D flip-flop 113 is coupled to the output clock signal oCLK and generates a second pulse signal DOWN1. The first and second D flip-flops 111,113 are also commonly coupled to an output of the first OR gate 125 and a clear signal "1". The first and second pulse signals UP1, DOWN1 are also input signals to the first AND gate 121, and the first AND gate 121 generates an output signal received by a first input of the first OR gate 125.

In the second phase detector circuit, the third D flip-flop 115 is coupled to the modulated frequency clock signal ICLK and generates a third pulse signal UP2, and the fourth D flip-flop 117 is coupled to the output clock signal OCLK and generates a fourth pulse signal DOWN2. The third and fourth D flip-flops 115,117 are also commonly coupled to an output of the second OR gate 127 and a clear signal "1". The third and fourth pulse signals UP2, DOWN2 are also input signals to the second AND gate 123, and the second AND gate 123 generates an output signal received by a first input of the second OR gate 127.

To set the mode of the first and second phase detector circuits, the fifth D flip-flop 119 is coupled to an inverted signal of the modulated frequency clock signal ICLK as a signal divider circuit. The fifth D flip-flop 119 generates a first divider output signal divQ and an opposite second divider output signal divQB. A second input of the first OR gate 125 receives the first divider output signal divQ of the fifth D flip-flop 119, to determine if the first phase detector circuit is in the "reset" mode or the "operational" mode, and a second input of the second OR gate 127 receives the second divider output signal divQB of the fifth D flip-flop 119 to determine if the second phase detector circuit is in the "reset" mode or the "operational" mode.

Figure 20:
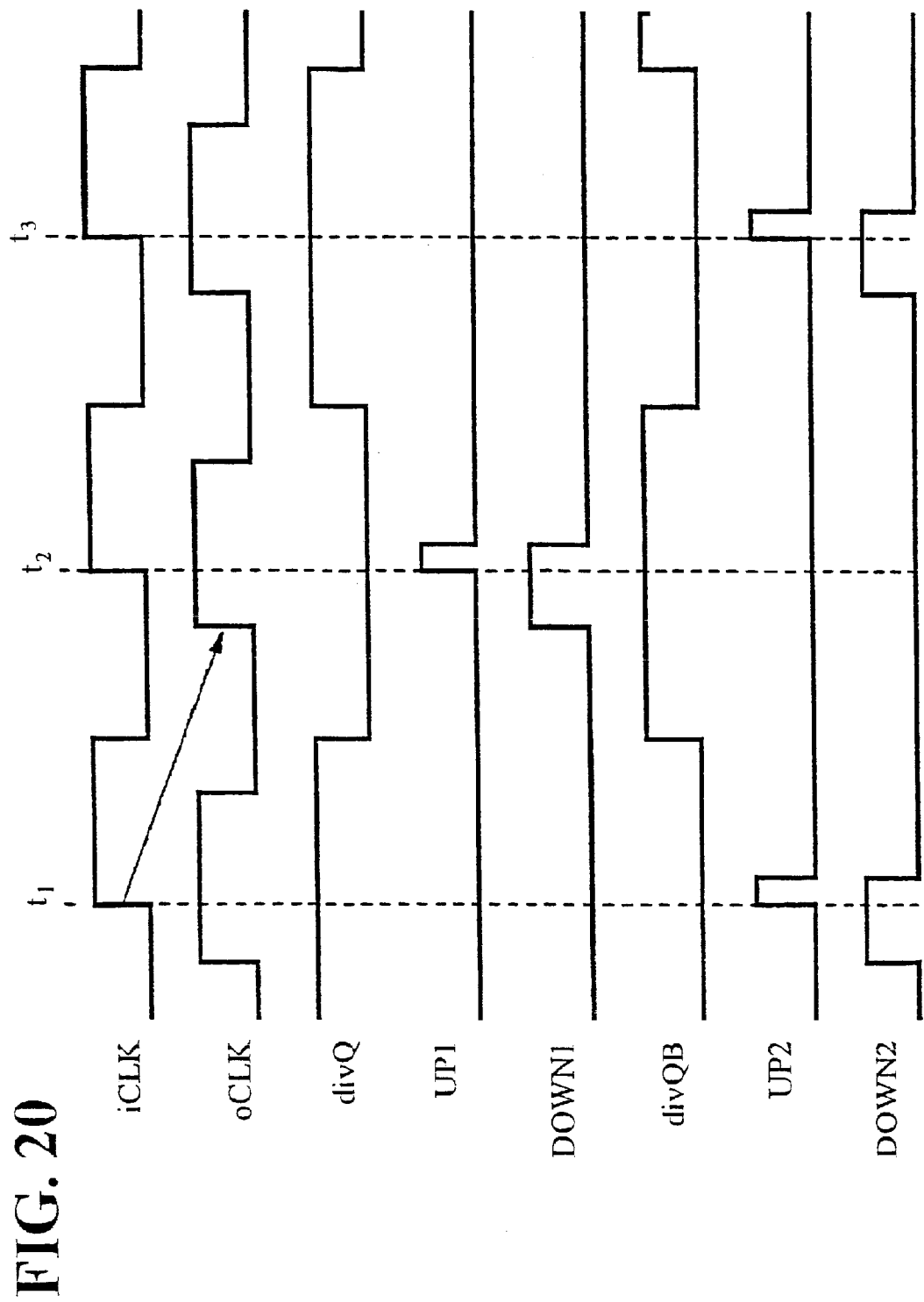
FIG. 20 illustrates an operation of the phase detector according to the preferred embodiment of the present invention.

FIG. 20 illustrates an operation of the phase detector 71 according to the method embodying the present invention.

When the first divider output signal divQ of the fifth D flip-flop 119 is set to "1," the second divider output signal divQB of the fifth D flip-flop 119 is set to "0". Correspondingly, the first phase detector circuit is in the "reset" mode and the second phase detector circuit is in the "operational" mode, and the first and second pulse signals UP1, DOWN1 are set to "0" at a first time $t_1$. The second phase detector circuit generates the third pulse signal UP2 when the modulated frequency clock signal value of "1" is detected, and generates the fourth pulse signal DOWN2 when the output clock signal value of "1" is detected. Thus, the charge pump 72 generates the output signal based on the input values generated by the phase detector 71. When the first and second divider output signals div Q, div QB are reversed at a second time $t_2$, the first phase detector circuit is in the "operational" mode and the second phase detector circuit is in the "reset" mode.

The improved clock recovery circuit and method therefor embodying the present invention has various advantages. The zero-delay buffer circuit using DLL has inherently low jitter and low skew compared with the related art zero-delay buffer using PLL.

Further, because the signal divider of the phase detector periodically resets the first and second phase detection circuits to clear their memories, phase tracking is performed in the correct direction. Thus, the related art problem of phase ambiguity is eliminated.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A spread-spectrum clocking (SSC) system for generating an output clock signal having a reduced electromagnetic emission (EMI), comprising:

a SSC generator circuit that receives an input clock signal and generates a modulated frequency clock signal; and a zero-delay buffer circuit that receives and buffers said modulated frequency clock signal to generate an output clock signal, the zero-delay buffer circuit aligning a phase of the modulated frequency clock signal and the output clock signal such that there is no phase difference between the output clock signal and the modulated frequency clock signal, wherein the zero-delay buffer circuit is a delay-locked loop (DLL) circuit comprises:

a phase detector device that receives the modulated frequency clock signal and the output clock signal to generate phase detector output signals indicative of a phase difference between the modulated frequency clock signal and the output clock signal;

a charge pump circuit coupled to the phase detector device for receiving the phase detector output signals and generating charge pump signals;

a loop filter circuit receiving the charge pump signals; and a voltage controlled delay chain (VCDC) circuit coupled to the loop filter and the phase detector, wherein the VCDC circuit aligns phases of the modulated frequency clock signal and the output clock signal, wherein the phase detector device further comprises:

a first phase detector circuit that receives the modulated frequency clock signal and generates first and second pulse signals indicative of one of a rising edge and a falling edge of the modulated frequency clock signal and the output clock signal, respectively;

a second phase detector circuit that receives the modulated frequency clock signal and generates third and fourth pulse signals indicative of one of the rising edge and the falling edge of the modulated frequency clock signal and the output clock signal, respectively; and a signal divider circuit to alternatively operate the first and second phase detector circuit in one of an operational mode and a reset mode, wherein the first phase detector comprises:

first and second logic gates, an output of the first logic gate being coupled to a first input of the second logic gate and a second input of the second logic gate being coupled to a first output of the signal divider circuit, a first flip-flop coupled to a first input of the first logic gate, a constant signal, and an output of the second logic gate and responsive to the modulated frequency clock signal, a second flip flop coupled to a second input of the first logic gate, the constant signal, and the output of the second logic gate and responsive to the output clock signal;

wherein the second phase detector circuit comprises:

third and fourth logic gates, an output of the third logic gate being coupled to a first input of the fourth logic gate and a second input of the fourth logic gate being coupled to a second output of the signal divider circuit, a third flip flop coupled to a first input of a third logic gate, the constant signal, and an output of the fourth logic gate and responsive to the modulated frequency clock signal.

a fourth flip flop coupled to a second input of the third logic gate, the constant signal, and the output of the fourth logic gate, and responsive to the output clock signal, and the signal divider circuit comprises a fifth flip-flop coupled to the modulated frequency clock signal and inputs of the second and fourth logic gates.

2. The zero-delay buffer circuit of claim 1 wherein the first and third logic gates are AND logic gates, and the second and fourth logic gates are OR logic gates.

3. A spread-spectrum clocking (SSC) system for generating an output clock signal having a reduced electromagnetic emission (EMI), comprising:

a SSC generator circuit that receives an input clock signal and generates a modulated frequency clock signal; and a zero-delay buffer circuit that receives and buffers said modulated frequency clock signal to generate an output clock signal, the zero-delay buffer circuit aligning a phase of the modulated frequency clock signal and the output clock signal such that there is no phase difference between the output clock signal and the modulated frequency clock signal, wherein the zero-delay buffer circuit is a delay-locked loop (DLL) circuit comprises:

a phase detector device that receives the modulated frequency clock signal and the output clock signal to generate phase detector output signals indicative of a phase difference between the modulated frequency clock signal and the output clock signal;

a charge pump circuit coupled to the phase detector device for receiving the phase detector output signals and generating charge pump signals;

a loop filter circuit receiving the charge pump signals; and a voltage controlled delay chain (VCDC) circuit coupled to the loop filter and the phase detector, wherein the VCDC circuit aligns phases of the modulated frequency clock signal and the output clock signal, wherein the VCDC circuit further comprises:

a delayed pulse generator that receives and delays the modulated frequency clock signal to generate a delayed modulated frequency clock signal, and generates a first output signal and a second output signal based on the delayed modulated frequency clock signal;

a first delay line circuit that receives the first output signal, a control signal and a second delay line circuit output signal indicative of a delay between the output clock signal and the modulated frequency clock signal, and generates a plurality of third output signals controlled by the control signal, wherein the third output signals are indicative of the delay between the output clock signal and the delayed modulated frequency clock signal;

a controller circuit that receives the second output signal and the third output signals and generates the control signal, wherein the control signal is indicative of a delay between the second output signal and the third output signals; and a second delay line circuit that receives the control signal, the modified frequency clock signal and the phase detector output signal to generate the output clock signal and the second delay line circuit output signal.

4. The zero delay buffer circuit of claim 3, wherein the first delay line circuit further comprises:

a first coarse delay line circuit that receives the first output signal and the control signal and generates a first coarse delay line circuit output signal;

a first fine delay line circuit that receives the first coarse delay line circuit output signal and the second delay line circuit output signal and generates a first fine delay line circuit output signal; and a first buffer circuit that receives the first fine delay line circuit output signal and generates the third output signals;

wherein the second delay line circuit comprises:

a second coarse delay line circuit that receives the modulated frequency output signal and the control signal and generates a second coarse delay line circuit output signal indicative of a delay between the modulated frequency clock signal and the output clock signal, a second fine delay line circuit that receives the second coarse delay line circuit output signal and the phase detector output signal and generates the second delay line circuit output signal, and a second buffer circuit that receives the second delay line circuit output signal and generates the output clock signal.

5. The zero delay buffer circuit of claim 4, wherein the first coarse delay line circuit comprises:

a coarse delay line having plurality of coarse delay cells that receive and delay the delayed modulated frequency clock signal and generate a corresponding plurality of coarse delay cell output signals; and a multiplexer that receives the plurality of coarse delay cell output signals and the control signal to generate the first coarse delay line circuit output signal.

6. The zero delay buffer circuit of claim 4, wherein the second fine delay line circuit comprises a fine delay line having plurality of fine delay line cells that receive the coarse delay line circuit output signal and the phase detector output signal, delay the second coarse delay line output signal based on the phase detector output signal, and generate the second delay line circuit output signal.

7. The zero delay buffer circuit of claim 3, wherein the controller circuit comprises:

a plurality of lock detectors that receive the second output signal and the third output signals and generate corresponding lock detector output signals;

a logic circuit that receives the lock detector output signals and a delayed third output signal and generates a fourth output signal based on the lock detector output signals and the delayed third output signal; and a counter that receives the fourth output signal and generates the control signal.

8. The zero delay buffer circuit of claim 7, wherein each of the lock detectors comprises:

a plurality of flip-flops that generate a plurality of fifth output signals, wherein each of the flip-flops receives the second output signal and one of the third output signals and generates one of the plurality of fifth output signals; and a NOR logic gate that receives the fifth output signals and generates one of the corresponding lock detector output signals indicative of a delay between the second output signal and the third output signals, wherein the logic circuit is an AND logic gate.

9. A delay-locked loop (DLL) circuit, comprising:

a phase detector device that receives a modulated frequency clock signal and an output clock signal to generate phase detector output signals indicative of a phase difference between the modulated frequency clock signal and the output clock signal;

a charge pump circuit coupled to the phase detector device for receiving the phase detector output signals and generating charge pump signals;

a loop filter circuit receiving the charge pump signals;

a voltage controlled delay chain (VCDC) circuit coupled to the loop filter and the phase detector device, wherein the VCDC circuit aligns phases of the modulated frequency clock signal and the output clock signal;

a delayed pulse generator that receives and delays the modulated frequency clock signal to generate a delayed modulated frequency clock signal, and generates a first output signal and a second output signal based on the delayed modulated frequency clock signal;

a first delay line circuit that receives the first output signal, a control signal and a second delay line circuit output signal indicative of a delay between the output clock signal and the modulated frequency clock signal, and generates a plurality of third output signals controlled by the control signal, wherein the third output signals are indicative of the delay between the output clock signal and the delayed modulated frequency clock signal;

a controller circuit that receives the second output signal and the third output signals and generates the control signal, wherein the control signal is indicative of a delay between the second output signal and the third output signals; and a second delay line circuit that receives the control signal, the modified frequency clock signal and the phase detector output signal to generate the output clock signal and the second delay line circuit output signal.

10. The DLL circuit of claim 9, wherein the phase detection device comprises:

a first phase detector circuit that receives the modulated frequency clock signal and generates first and second pulse signals indicative of one of a rising edge and a falling edge of the modulated frequency clock signal and the output clock signal, respectively;

a second phase detector circuit that receives the modulated frequency clock signal and generates third and fourth pulse signals indicative of one of the rising edge and the falling edge of the modulated frequency clock signal and the output clock signal, respectively; and a signal divider circuit to alternatively operate the first and second phase detector circuit in one of an operational mode and a reset mode.

11. The DLL circuit of claim 10, wherein the first phase detector circuit comprises:

first and second logic gates, an output of the first logic gate being coupled to a first input of the second logic gate and a second input of the second logic gate being coupled to a first output of the signal divider circuit, a first flip-flop coupled to a first input of the first logic gate, a constant signal, and an output of the second logic gate and responsive to the modulated frequency clock signal, a second flip flop coupled to a second input of the first logic gate, the constant signal, and the output of the second logic gate and responsive to the output clock signal;

the second phase detector circuit comprises:

third and fourth logic gates, an output of the third logic gate being coupled to a first input of the fourth logic gate and a second input of the fourth logic gate being coupled to a second output of the signal divider circuit, a third flip flop coupled to a first input of a third logic gate, the constant signal, and an output of the fourth logic gate and responsive to the modulated frequency clock signal, a fourth flip flop coupled to a second input of the third logic gate, the constant signal, and the output of the fourth logic gate, and responsive to the output clock signal, and the signal divider circuit comprises a fifth flip-flop coupled to the modulated frequency clock signal and inputs of the second and fourth logic gates.

12. The DLL circuit of claim 11, wherein the first and third logic gates are AND logic gates, and the second and fourth logic gates are OR logic gates.

13. A method of generating an output clock signal having a reduced electromagnetic emission (EMI), comprising:

generating a modulated frequency clock signal based on spread spectrum modulation having an amplitude less than an amplitude of the input clock signal; and aligning a phase of the modulated frequency clock signal with the output clock signal to eliminate phase differences between the output clock signal and the modulated frequency clock signal, wherein the aligning step comprises:

measuring a period of the modulated frequency clock signal to generate a first delayed modulated frequency clock signal;

measuring a period of the output clock signal;

generating a control signal indicative of a difference between the period of a digital signal that measures a time of the period of the first delayed modulated frequency clock signal, and a signal that measures a time of the period of the output clock signal;

delaying a phase of the modulated frequency clock signal based on the control signal to generate a second delayed modulated frequency clock signal;

detecting a phase difference between the modulated frequency clock signal and the output clock signal; and aligning edges of the second delayed modulated frequency clock signal based on the phase difference.

14. A phase detection device, comprising:

a first phase detector circuit that receives a modulated frequency clock signal and generates first and second pulse signals indicative of one of a rising edge and a falling edge of the modulated frequency clock signal and an output clock signal, respectively;

a second phase detector circuit that receives the modulated frequency clock signal and generates third and fourth pulse signals indicative of one of the rising edge and the falling edge of the modulated frequency clock signal and the output clock signal, respectively; and a signal divider circuit to alternatively operate the first and second phase detector circuits in one of an operational mode and a reset mode, wherein the first phase detector circuit comprises:

first and second logic gates, an output of the first logic gate being coupled to a first input of the second logic gate and a second input of the second logic gate being coupled to a first output of the signal divider circuit, a first flip-flop coupled to a first input of the first logic gate, a constant signal, and an output of the second logic gate and responsive to the modulated frequency clock signal, a second flip-flop coupled to a second input of the first logic gate, the constant signal, and the output of the second logic gate and responsive to the output clock signal, and wherein the second phase detector circuit comprises:

third and fourth logic gates, an output of the third logic gate being coupled to a first input of the fourth logic gate and a second input of the fourth logic gate being coupled to a second output of the signal divider circuit, a third flip-flop coupled to a first input of a third logic gate, the constant signal, and an output of the fourth logic gate and responsive to the modulated frequency clock signal, a fourth flip-flop coupled to a second input of the third logic gate, the constant signal, and the output of the fourth logic gate, and responsive to the output clock signal, and the signal divider circuit comprises a fifth flip-flop coupled to the modulated frequency clock signal and inputs of the second and fourth logic gates.

15. The phase detection device of claim 14, wherein the first gate and third logic gates are AND gates, and the second and fourth logic gates are OR gates.

* * * * *